United States Patent [19]
Awamoto et al.

[11] Patent Number: 5,311,006
[45] Date of Patent: May 10, 1994

[54] INFRARED PHOTODETECTOR FORMED BY ARRAY OF SEMICONDUCTOR ELEMENTS SHAPED TO HAVE INCREASED ELECTRON DIFFUSION AREA

[75] Inventors: Kenji Awamoto; Yuichiro Ito, both of Kawasaki, Japan

[73] Assignee: Fujitsu Limited, Kanagawa, Japan

[21] Appl. No.: 971,599

[22] Filed: Nov. 5, 1992

[30] Foreign Application Priority Data

Nov. 20, 1991 [JP] Japan .................................. 3-304862

[51] Int. Cl.[5] .......................................... H01L 31/00
[52] U.S. Cl. .................................. 250/208.1; 257/444; 257/465
[58] Field of Search ............... 250/208.1, 214.1, 578.1; 257/226, 442, 443, 465, 231, 233, 459, 461, 444; 358/213.11, 213.12, 213.23, 213.27, 213.28, 212

[56] References Cited

U.S. PATENT DOCUMENTS

| | | | |
|---|---|---|---|
| 4,471,387 | 9/1984 | Nadler | 250/208.1 X |
| 4,652,899 | 3/1987 | Hoeberechts | 257/465 |
| 4,783,594 | 11/1988 | Schulte et al. | |
| 4,835,587 | 5/1989 | Sato et al. | |
| 4,916,503 | 4/1990 | Uematsu et al. | |

FOREIGN PATENT DOCUMENTS

WO89/05042 6/1298 European Pat. Off. .
2813671 10/1978 Fed. Rep. of Germany .

OTHER PUBLICATIONS

Patent Abstracts of Japan, vol. 15, No. 308 (E-1097) Aug. 7, 1991 & JP-A-31 10 874 (Nissan Motor Co. Ltd.) May 10, 1991.

Primary Examiner—David C. Nelms
Assistant Examiner—John R. Lee
Attorney, Agent, or Firm—Armstrong, Westerman, Hattori, McLeland & Naughton

[57] ABSTRACT

A photodetector has a substrate made of a first semiconductor type and having a surface, and a plurality of independent diffusion regions formed in the surface of the substrate and made of a second semiconductor type which is opposite to the first semiconductor type so that a pn junction is formed between the substrate and each diffusion region. Discrete photosensitive areas are formed by each of the diffusion regions and blind areas are formed between adjacent ones of the photosensitive areas when a bias voltage is applied across each pn junction, where each of the photosensitive areas have the same area. At least predetermined ones of the diffusion regions have a main part and at least one auxiliary part which is electrically coupled to the main part, and the auxiliary part is provided in a region on the surface of the substrate towards a corresponding one of the blind areas relative to the main part, so that the blind area is reduced by a part of the photosensitive area formed by the auxiliary part of the diffusion region.

20 Claims, 10 Drawing Sheets

INFRARED PHOTODETECTOR FORMED BY ARRAY OF SEMICONDUCTOR ELEMENTS SHAPED TO HAVE INCREASED ELECTRON DIFFUSION AREA

BACKGROUND OF THE INVENTION

The present invention generally relates to photodetectors, and more particularly to a photodetector which has a photodetector part and a signal processing part provided on independent semiconductor substrates.

An infrared sensor (infrared image pickup element) has a photodetector part and a signal processing part provided on independent semiconductor substrates, and the photodetector part and the signal processing part are connected by bumps or the like. The infrared sensor is applied to apparatuses which detect and track an object by sensing the infrared ray which is emitted from the object. The infrared sensor which is applied to such apparatuses must be able to detect a fine object at a far distance.

FIG. 1 generally shows an example of a conventional infrared photodetector. In FIG. 1, (A) shows a plan view and (B) shows a cross sectional view along a line A—A in (A). This infrared photodetector includes a photodetector part 1 and a signal processing part 2 which are connected via electrodes 3.

The photodetector part 1 includes a p-type semiconductor substrate 1a, and a plurality of n-type semiconductor regions 1b which are formed in the p-type semiconductor substrate 1a by employing a diffusing technique or the like. For example, the p-type semiconductor substrate 1a is made of Hg-Cd-Te. The n-type semiconductor regions 1b have a circular shape in the plan view, and are arranged in a 3×3 matrix arrangement, for example. A pn junction 4 is formed between the p-type semiconductor substrate 1a and each n-type semiconductor region 1b.

The signal processing part 2 is formed by a Si charge coupled device (CCD) or the like. The signal processing part 2 is connected to the n-type semiconductor regions 1b of the photodetector part 1 via the electrodes 3, and processes signals received from the photodetector part 1. The signal is output from the photodetector part 1 when the p-type semiconductor substrate 1a receives infrared ray and a photoelectric conversion occurs via the pn junction 4. For example, the electrodes 3 are formed by bumps.

FIG. 2 is a diagram for explaining the operation of the infrared photodetector shown in FIG. 1. In FIG. 2, (A) shows a cross sectional view of the p-type substrate 1, and (B) shows the sensitivity versus position characteristic of one n-type semiconductor region 1b in correspondence with (A).

As shown in (A) of FIG. 2, electrons are generated in the p-type semiconductor substrate 1 when the infrared ray is irradiated on the photodetector part 1. Because the pn junctions 4 are reverse biased, the generated electrons are collected at the n-type semiconductor regions 1b and move to the signal processing part 2 via the electrodes 3.

Each n-type semiconductor region 1b has the sensitivity shown in (B) of FIG. 2. As shown, the sensitivity is a maximum at the center of the n-type semiconductor region 1b and decreases towards the periphery of the n-type semiconductor region 1b.

On the other hand, the electrodes generated in the p-type semiconductor substrate 1a disappear after moving a diffusion length Le which is an average distance movable by each electron. Accordingly, in mid or far infrared photodectors for detecting the wavelengths of 2 to 15 μm, the diffusion length Le becomes 10 μm or greater, for example, and the diffusion length Le can no longer be neglected compared to the diameter d of the n-type semiconductor region 1b and the pitch P at which the n-type semiconductor regions 1b are arranged. For this reason, in such mid or far infrared photodetectors, the electron which is generated at a distance Le from the pn junction 4 is also collected by the n-type semiconductor region 1b as shown in FIG. 3. In FIG. 3, (A) shows the cross section of the photodetector part 1 and (B) shows the plan view of the photodetector part 1. In the case shown in FIG. 3, an effective photosensitive area of the n-type semiconductor region 1b becomes a distance L ($\approx$Le) greater in radius compared to the area of the pn junction 4, as indicated by a dotted line. This area indicated by the dotted line substantially corresponds to the size of one pixel.

FIG. 4 is a diagram for explaining examples of the light receiving range of the conventional photodetector. In FIG. 4, each region surrounded by a dotted line indicates one n-type semiconductor region 1b, and each region surrounded by a solid line indicates the effective photosensitive area of one n-type semiconductor region 1b. As shown in FIG. 4, the adjacent n-type semiconductor regions 1b are arranged so that the effective photosensitive areas thereof do not overlap, in order to prevent crosstalk between the adjacent n-type semiconductor regions 1b.

In FIG. 4, (A) shows a case where the n-type semiconductor regions 1b indicated by the dotted line have a circular shape in the plan view. In this case, each effective photosensitive area 5 of the n-type semiconductor region 1b also has a circular shape in the plan view as indicated by the solid line.

In FIG. 4, (B) shows a case where the n-type semiconductor regions 1b indicated by the dotted line have a square shape in the plan view. In this case, each effective photosensitive area 5 of the n-type semiconductor region 1b has a generally square shape with rounded corners in the plan view as indicated by the solid line.

In FIG. 4, (C) shows a case where the n-type semiconductor region 1b indicated by the dotted line have a square shape in the plan view. In this case, each effective photosensitive area 5 of the n-type semiconductor region 1b has a generally square shape with rounded corners in the plan view as indicated by the solid line. But unlike the case shown in FIG. 4 (B), the positions of the n-type semiconductor regions 1b in one horizontal row are shifted in the horizontal direction with respect to the positions of the n-type semiconductor regions 1b in the next horizontal row. In other words, the positions of the n-type semiconductor regions 1b are not aligned vertically as in the case shown in FIG. 4 (B).

In FIG. 4, a blind area 6 is formed between the adjacent effective photosensitive areas 5. The shape of the effective photosensitive areas 5 shown in (B) enables the blind area 6 to be reduced compared to the case shown in (A). In the case shown in (C), each blind area 6 is smaller than the blind area 6 shown in (B), but the number of the blind areas 6 is larger in (C) than in (B), and the total of the blind areas 6 in (C) is not reduced compared to the total of the blind areas 6 in (B).

Therefore, the conventional infrared photodetector suffered from the following problems. First, if the n- type semiconductor regions 1b are arranged so that the effective photosensitive areas 5 do not overlap, the blind areas 6 are inevitably formed and the infrared ray cannot be detected at the blind areas 6. Second, if the areas of the n-type semiconductor regions 1b are increased so as to reduce the blind areas 6, the effective photosensitive areas 5 overlap and the crosstalk between the adjacent n-type semiconductor regions 1b increases.

On the other hand, in the photodetectors which detect visible rays, the diffusion length Le is negligibly small, and the shape of the n-type semiconductor region 1b substantially corresponds to the effective photosensitive area. The visible ray photodetector has a monolithic structure, and the pn junction, signal transmission lines, switching gates and the like are all formed on a single Si substrate, for example. Because the parts of the Si substrate where the signal transmission lines, the switching gates and the like are provided become blind areas, measures were conventionally taken to reduce the size of the transmission lines, switching gates and the like in order to increase the photodiode area. However, such conventional measures taken in the visible ray photodetector cannot be applied to the infrared photodetector, that is, do not help solve the problems described above.

SUMMARY OF THE INVENTION

Accordingly, it is a general object of the present invention to provide a novel and useful photodetector in which the above described problems are overcome.

Another and more specific object of the present invention is to provide a photodetector comprising a substrate made of a first semiconductor type and having a surface, and a plurality of independent diffusion regions formed in the surface of the substrate and made of a second semiconductor type which is opposite to the first semiconductor type so that a pn junction is formed between the substrate and each diffusion region, where discrete photosensitive areas are formed by each of the diffusion regions and blind areas are formed between adjacent ones of the photosensitive areas when a bias voltage is applied across each pn junction, each of the photosensitive areas have the same area, at least predetermined ones of the diffusion regions have a main part and at least one auxiliary part which is integrally formed on the main part, and the auxiliary part projects towards a corresponding one of the blind areas, so that the blind area is reduced by a part of the photosensitive area formed by the auxiliary part of the diffusion region. According to the photodetector of the present invention, the photosensitive area is increased and the blind area is minimized without introducing crosstalk between the adjacent pn junctions. Therefore, it is possible to considerably improve the detection accuracy of the photodetector.

Still another object of the present invention is to provide a photodetector comprising a substrate made of a first semiconductor type and having a surface, and a plurality of independent diffusion regions formed in the surface of the substrate and made of a second semiconductor type which is opposite to the first semiconductor type so that a pn junction is formed between the substrate and each diffusion region, where discrete photosensitive areas are formed by each of the diffusion regions and blind areas are formed between adjacent ones of the photosensitive areas when a bias voltage is applied across each pn junction, each of the photosensitive areas have the same area, at least predetermined ones of the diffusion regions have a main part and at least one auxiliary part which is independent of the main part on the surface of the substrate but electrically coupled to the main part, and the auxiliary part is provided in a region on the surface of the substrate towards a corresponding one of the blind areas relative to the main part, so that the blind area is reduced by a part of the photosensitive area formed by the auxiliary part of the diffusion region. According to the photodetector of the present invention, the photosensitive area is increased and the blind area is minimized without introducing crosstalk between the adjacent pn junctions. Therefore, it is possible to considerably improve the detection accuracy of the photodetector.

Other objects and further features of the present invention will be apparent from the following detailed description when read in conjunction with the accompanying drawings.

DESCRIPTION OF THE PREFERRED EMBODIMENTS

Figure 5:
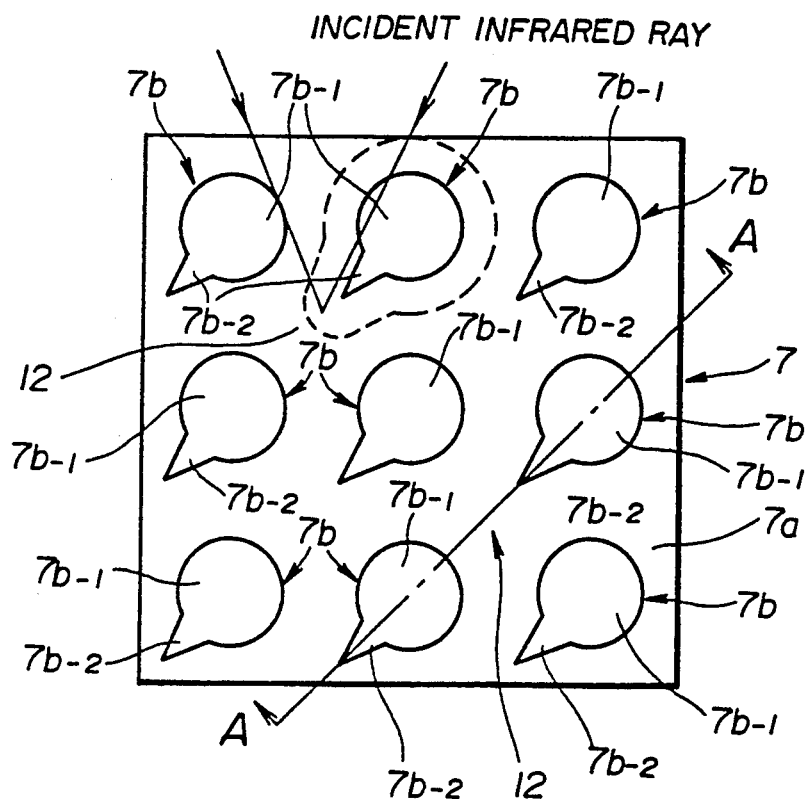
FIG. 5(A) is a schematic elevational diagram for explaining a first embodiment of a photodetector according to the present invention.
FIG. 5(B) is schematic side view of the photodetector shown in FIG. 5(A)
Figure 5:
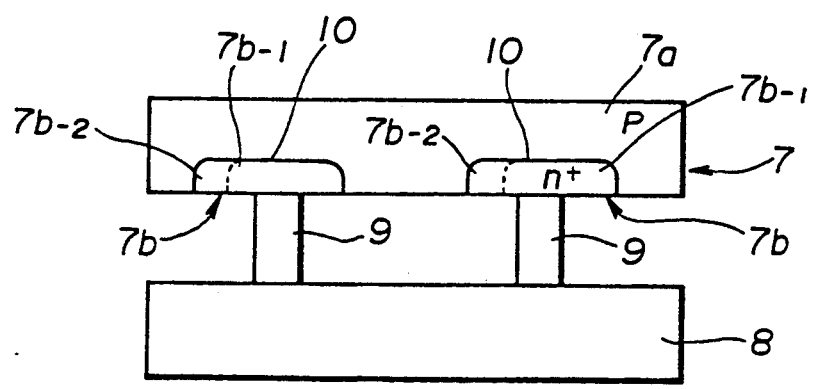
Figure 6:
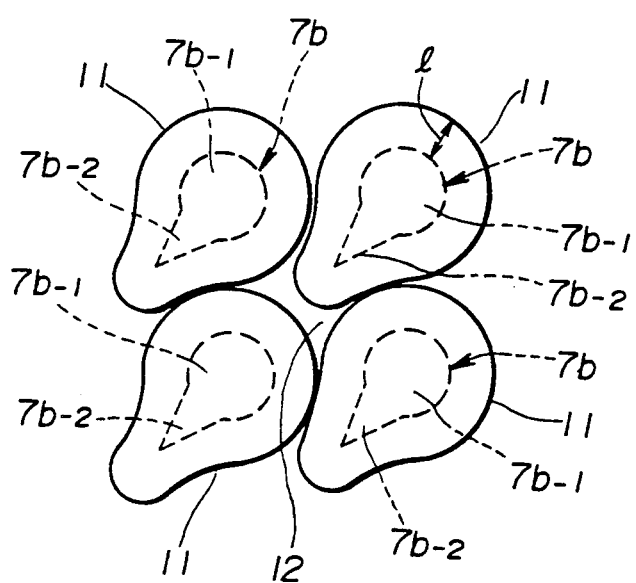
FIG. 6 is a diagram for explaining the light receiving range of the first embodiment.

A description will be given of a first embodiment of a photodetector according to the present invention, by referring to FIGS. 5 and 6. In FIG. 5, (A) shows a plan view of the photodetector, and (B) shows a cross sectional view along a line A—A in (A). FIG. 6 is a diagram for explaining the light receiving range of the first embodiment.

In this embodiment, a photodetector part 7 includes a p-type semiconductor substrate 7a, and a plurality of n-type semiconductor regions 7b which are formed in the p-type semiconductor substrate 7a by employing a diffusing technique or the like. For example, the p-type semiconductor substrate 7a is made of Hg-Cd-Te. The n-type semiconductor regions 7b have a circular shape in the plan view, and are arranged in a 3×3 matrix arrangement, for example. A pn junction 10 is formed between the p-type semiconductor substrate 7a and each n-type semiconductor region 7b.

A signal processing part 8 is formed by a Si CCD or the like. The signal processing part 8 is connected to the n-type semiconductor regions 7b of the photodetector part 7 via electrodes 9, and processes signals received from the photodetector part 7. The signal is output from the photodetector part 7 when the p-type semiconductor substrate 7a receives infrared ray and a photoelectric conversion occurs via the pn junction 10. For example, the electrodes 9 are formed by bumps.

Each n-type semiconductor region 7b has a shape including a circular main part 7b-1 and a projecting part 7b-2 which is integrally formed on the main 7b-1. The projecting part 7b-2 projects towards a blind area 12 which is surrounded by four mutually adjacent n-type semiconductor regions 7b.

Figure 1A:
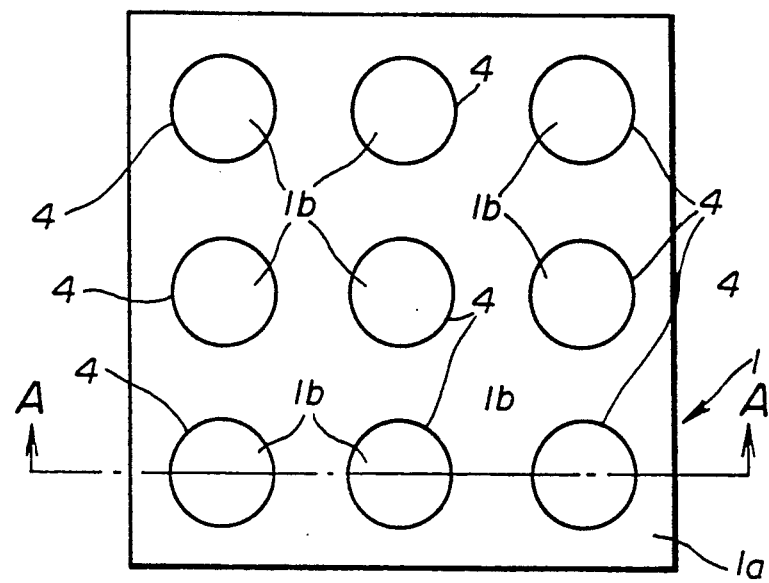
FIG. 1(A) is an elevational view of an example of a conventional infrared photodetector.
Figure 1B:
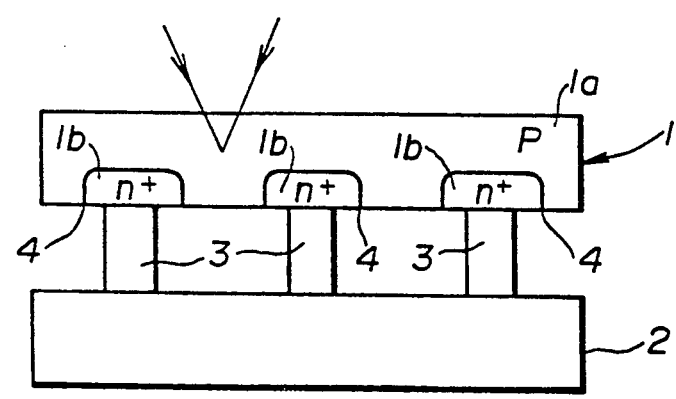
FIG. 1(B) is a sectional view taken along line A—A of FIG. 1(A)
Figures 2A, 2B:
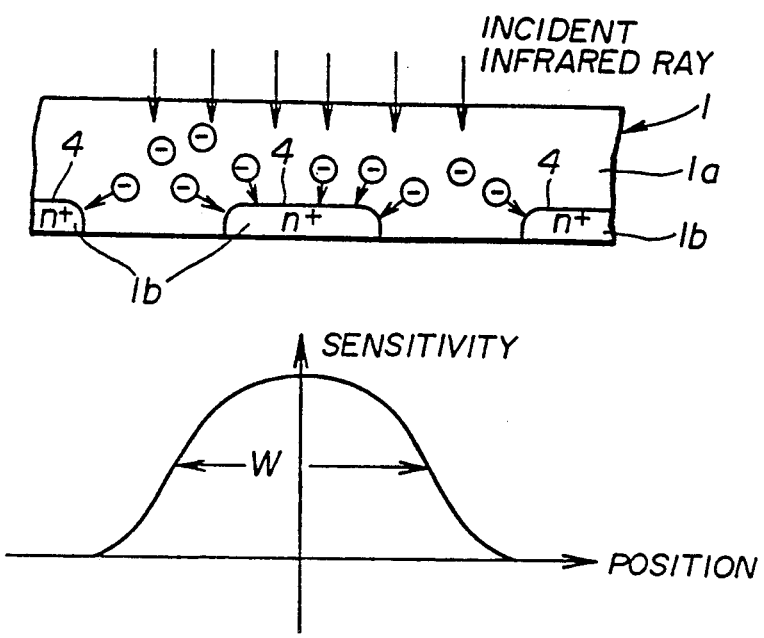
FIG. 2(A) is a diagram for explaining the operation of the photodetector.
FIG. 2(B) is a graph showing sensitivity of the arrangement shown in FIG. 2(A)
Figure 3A:
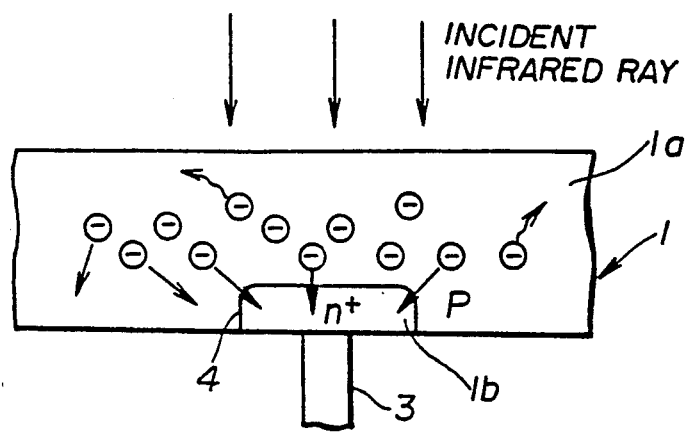
FIG. 3(A) is a schematic diagram for explaining the light receiving range of the conventional photodetector.
Figure 3B:
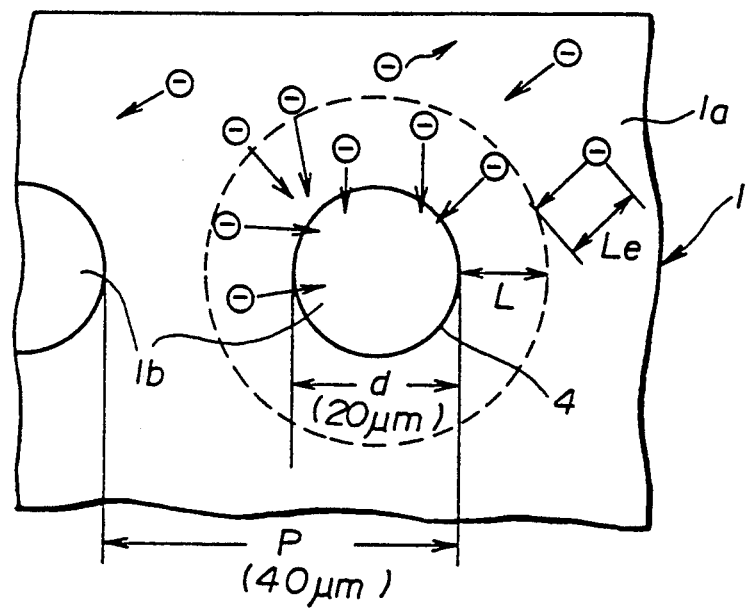
FIG. 3(B) is an elevational view of the photodetector of FIG. 3(A)
Figure 4A:
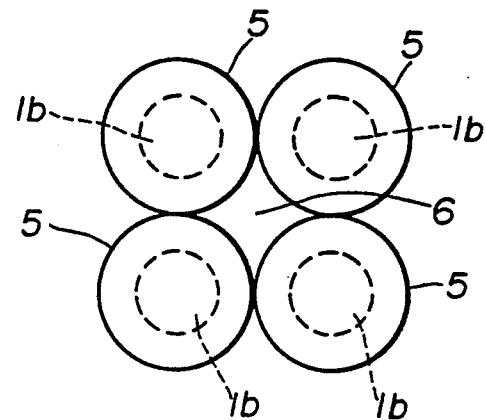
FIG. 4(A) is a diagram for explaining a first example of the light receiving range of a conventional photodetector.
Figure 4B:
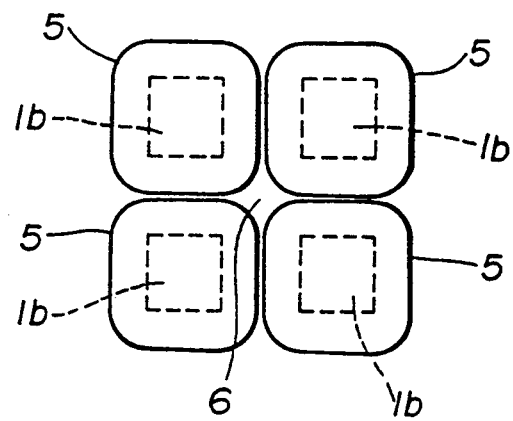
FIG. 4(B) is a diagram for explaining a second example of the light receiving range of a second conventional photodetector.
Figure 4C:
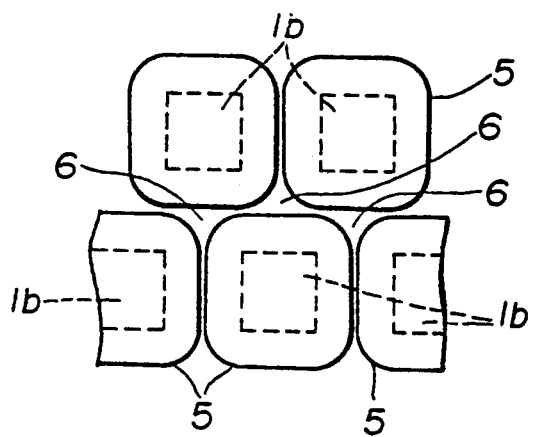
FIG. 4(C) is a diagram for explaining a third example of the light receiving range of a third conventional photodetector.

In FIG. 6, each n-type semiconductor region 7b is indicated by a dotted line, and each effective photosensitive area 11 is indicated by a solid line. As may be seen from FIG. 6, the provision of the projecting part 7b-2 increases the area of the effective photosensitive area 11 compared to the effective photosensitive area which would be formed by the main 7b-1 alone. As a result, it is possible to reduce the blind area 12 without introducing crosstalk and to increase the effective photosensitive area 11, as may be seen from the comparison of FIG. 4 (A) and FIG. 6. Therefore, it is possible to positively detect and track an object using this photodetector.

In FIG. 6, the infrared ray incident to the projecting part 7b-2 is detected as the infrared incident to the n-type semiconductor region 7b which includes both the main 7b-1 and the projecting part 7b-2. For this reason, when picking up an image of a distant object by use of this photodetector, an error is introduced in the detected position of the distant object. However, when detecting and tracking the object, the positional error amounting to one pixel or less does not cause a problem. Furthermore, if the object becomes closer to the photodetector, the spot of the infrared ray becomes greater than the size of one pixel, and the position of the object can be accurately detected without being affected by the positional error described above and the blind area 12.

Figure 7A:
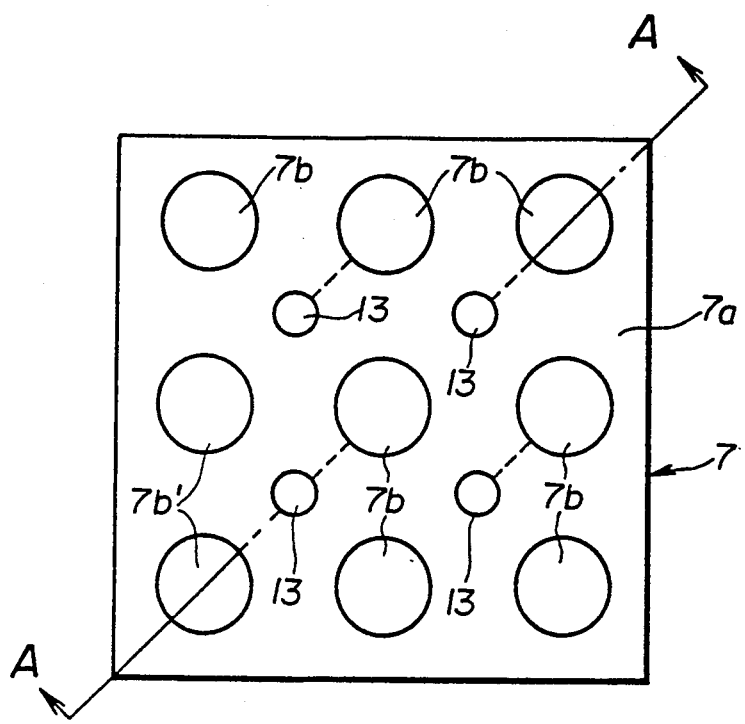
FIG. 7(A) is a schematic elevational diagram for explaining a second embodiment of the photodetector according to the present invention.
Figure 7B:
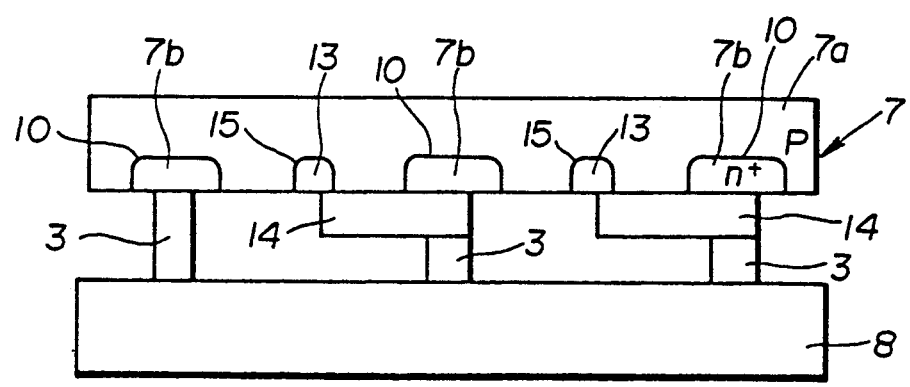
FIG. 7(B) is schematic side view of the photodetector shown in FIG. 7(A)
Figure 8:
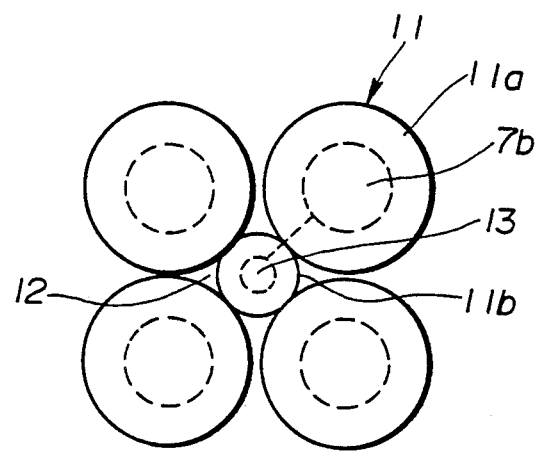
FIG. 8 is a diagram for explaining the light receiving range of the second embodiment.

Next, a description will be given of a second embodiment of the photodetector according to the present invention, by referring to FIGS. 7 and 8. In FIG. 7, (A) shows a plan view of the photodetector, and (B) shows a cross sectional view along a line A—A in (A). FIG. 8 is a diagram for explaining the light receiving range of the second embodiment. In FIGS. 7 and 8, those parts which are basically the same as those corresponding parts in FIGS. 5 and 6 are designated by the same reference numerals, and a description thereof will be omitted.

In this embodiment, an auxiliary n-type semiconductor region 13 is provided independently with respect to each n-type semiconductor region 7b which forms a pair with the auxiliary n-type semiconductor region 13. A pn junction 15 is formed between the auxiliary n-type semiconductor region 13 and the p-type semiconductor substrate 7. As indicated by a dotted line in FIG. 7 (A) and as shown in FIG. 7 (B), the pair of n-type semiconductor regions 7b and 13 are electrically connected via a connecting electrode 14.

In FIG. 8, an effective photosensitive area 11a is formed by the n-type semiconductor region 7b, and an effective photosensitive area 11b is formed by the auxiliary n-type semiconductor region 13. As a result, the effective photosensitive areas 11a and 11b form the effective photosensitive area 11 of the pair of n-type semiconductor regions 7b and 13. As may be seen from FIG. 8, the provision of the auxiliary n-type semiconductor regions 13 increases the area of the effective photosensitive area 11 compared to the effective photosensitive area which would be formed by the n-type semiconductor region 7b alone. As a result, it is possible to reduce the blind area 12 without introducing crosstalk and to increase the effective photosensitive area 11, as may be seen from the comparison of FIG. 4 (A) and FIG. 8. Therefore, it is possible to positively detect and track an object using this photodetector.

In FIG. 7 (B), the pair of n-type semiconductor regions 7b and 13 are electrically connected by the connecting electrode 14. However, it is possible to use other means such as a signal line to electrically connect the pair of n-type semiconductor regions 7b and 13, and the signal line may be provided on the p-type semiconductor substrate 7 or on the signal processing part 8. When connecting the pair of n-type semiconductor regions 7b and 13 on the signal processing part 8, an electrode similar to the electrode 3 needs to be provided so as to connect the auxiliary n-type semiconductor region 13 and the signal processing part 8.

Figure 9:
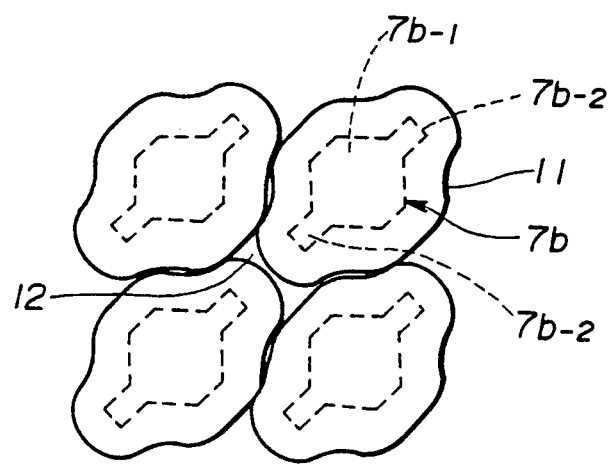
FIG. 9 is a diagram for explaining the light receiving range of a third embodiment of the photodetector according to the present invention.

Next, a description will be given of a third embodiment of the photodetector according to the present invention, by referring to FIG. 9. FIG. 9 is a diagram for explaining the light receiving range of the third embodiment. In FIG. 9, those parts which are basically the same as those corresponding parts in FIGS. 5 and 6 are designated by the same reference numerals, and a description thereof will be omitted.

In this embodiment, each n-type semiconductor region 7b is made up of a generally rectangular main part 7b-1 and a pair of projecting parts 7b-2 which are integrally formed on the main part 7b-1. As a result, the effective photosensitive area 11 of each n-type semiconductor region 7b has a shape indicated by the solid line in FIG. 9. As may be seen from FIG. 9, the provision of the projecting parts 7b-2 increases the area of the effective photosensitive area 11 compared to the effective photosensitive area which would be formed by the main part 7b-1 alone. As a result, it is possible to reduce the blind area 12 without introducing crosstalk and to increase the effective photosensitive area 11, as may be seen from the comparison of FIG. 4 (B) and FIG. 9.

Therefore, it is possible to positively detect and track an object using this photodetector.

Figure 10:
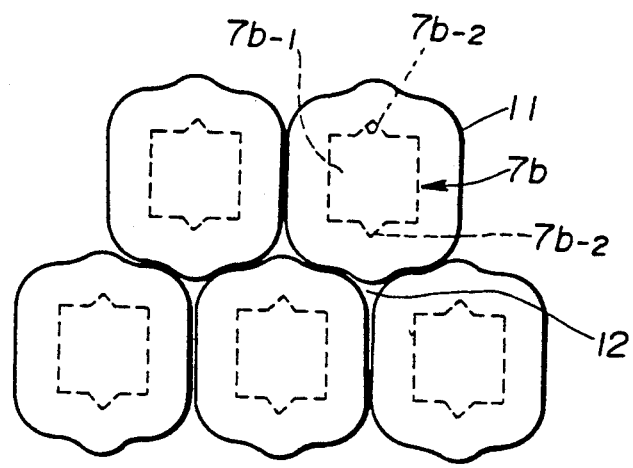
FIG. 10 is a diagram for explaining the light receiving range of a fourth embodiment of the photodetector according to the present invention.

Next, a description will be given of a fourth embodiment of the photodetector according to the present invention, by referring to FIG. 10. FIG. 10 is a diagram for explaining the light receiving range of the fourth embodiment. In FIG. 10, those parts which are basically the same as those corresponding parts in FIGS. 5 and 6 are designated by the same reference numerals, and a description thereof will be omitted.

In this embodiment, each n-type semiconductor region 7b is made up of a generally rectangular main part 7b-1 and a pair of projecting parts 7b-2 which are integrally formed on the main part 7b-1, similarly to the third embodiment, but the positions of the n-type semiconductor regions 1b in one horizontal row are shifted in the horizontal direction with respect to the positions of the n-type semiconductor regions 1b in the next horizontal row. In other words, the positions of the n-type semiconductor regions 1b are not aligned vertically as in the case of the third embodiment. As a result, the effective photosensitive area 11 of each n-type semiconductor region 7b has a shape indicated by the solid line in FIG. 10. As may be seen from FIG. 10, the provision of the projecting parts 7b-2 increases the area of the effective photosensitive area 11 compared to the effective photosensitive area which would be formed by the main part 7b-1 alone. As a result, it is possible to reduce the blind area 12 without introducing crosstalk and to increase the effective photosensitive area 11, as may be seen from the comparison of FIG. 4 (C) and FIG. 10. Therefore, it is possible to positively detect and track an object using this photodetector.

In the embodiments described above, the n-type semiconductor regions 7b in the plan view have the same shape. However, the shapes of the n-type semiconductor regions 7b may be different as long as the areas thereof, that is, the effective photosensitive areas, are the same. In other words, the effective photosensitive area which corresponds to one pixel must be the same among the n-type semiconductor regions 7b.

Figure 11:
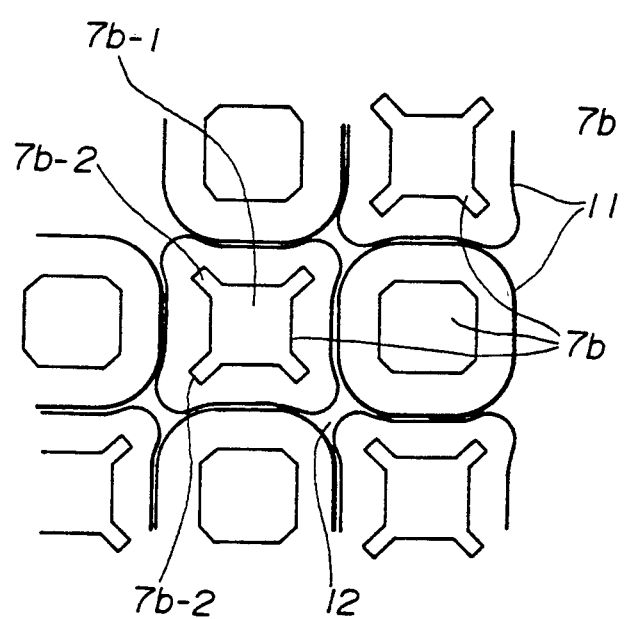
FIG. 11 is a diagram for explaining the light receiving range of a fifth embodiment of the photodetector according to the present invention.

Next, a description will be given of a fifth embodiment of the photodetector according to the present invention, by referring to FIG. 11. FIG. 11 is a diagram for explaining the light receiving range of the fifth embodiment. In FIG. 11, those parts which are basically the same as those corresponding parts in FIGS. 5 and 6 are designated by the same reference numerals, and a description thereof will be omitted.

In this embodiment, a first group of diagonally arranged n-type semiconductor regions 7b and a second group of diagonally arranged n-type semiconductor regions 7b have mutually different shapes as shown in FIG. 11. However, the effective photosensitive area 11 of the n-type semiconductor region 7b of the first group and the effective photosensitive area 11 of the n-type semiconductor region 7b of the second group are the same. The shapes of the n-type semiconductor regions 7b of the two groups are selected so as to minimize the blind area 12.

Of course, the positional arrangement of the two groups of n-type semiconductor regions 7b is not limited to that shown in FIG. 11, and the number of different shapes of the n-type semiconductor regions 7b is not limited to two as long as the effective photosensitive areas are the same. Furthermore, the shifted matrix arrangement similar to that shown in FIG. 10 may be applied to this embodiment.

In addition, the shapes of the main part of the n-type semiconductor region 7b and the auxiliary part of the n-type semiconductor region 7b are not limited to those of the above described embodiments, both for the case where the auxiliary part is integrally formed on the main part and for the case where the auxiliary part is formed independently of the main part on the p-type semiconductor substrate 7. The shapes of the main and auxiliary parts of the n-type semiconductor regions 7b may be selected arbitrarily so as to minimize the blind area 12 without overlapping the adjacent effective photosensitive areas.

In the described embodiments, the p-type semiconductor substrate 7 is made of Hg-Cd-Te. However, other materials such as InSb, InAs and PbSnTe may be used for the p-type semiconductor substrate 7. Moreover, the bias voltage applied to the pn junction 10 may be zero or, the pn junction 10 may be reverse biased.

The substrate is made of a p-type semiconductor and the light receiving part is made of an n-type semiconductor in each of the embodiments described above. However, it is possible to use an n-type semiconductor substrate and form p-type semiconductor regions in the n-type semiconductor substrate. The same materials used for the p-type semiconductor substrate may be used for the n-type semiconductor substrate. The construction of the photodetector having the n-type semiconductor substrate is identical to that shown in FIGS. 5 through 11, except that the semiconductor type is opposite to those of the described embodiments. Otherwise, the operation and effects are the same as those of the described embodiments, and the same bias voltage described above may be used with respect to the pn junction.

The present invention is applied to the infrared photodetector in the described embodiments, and the effective photosensitive area 11 of each n-type semiconductor region 7b is greater than the area of the n-type semiconductor region 7b in the plan view. However, it is also possible to apply the present invention to the visible ray photodetector. In this case, the effective photosensitive area 11 of each n-type semiconductor region 7b is approximately the same as the area of the n-type semiconductor region 7b in the plan view, and the n-type semiconductor region 7b and thus the effective photosensitive areas 11 can be arranged so as to minimize the blind areas 12 without overlapping each other so that the crosstalk is prevented.

Further, the present invention is not limited to these embodiments, but various variations and modifications may be made without departing from the scope of the present invention.

What is claimed is:

1. A photodetector comprising:
   a substrate made of a first semiconductor type and having a surface; and
   a plurality of independent diffusion regions formed in the surface of said substrate and made of a second semiconductor type which is opposite to the first semiconductor type so that sa pn junction is formed between the substrate and each diffusion region,
   discrete photosensitive areas being formed by each of said diffusion regions and blind areas being formed between adjacent ones of said photosensitive areas when a bias voltage is applied across each pn junction,
   each of said photosensitive areas having the same area, at least predetermined ones of said diffusion regions having a main part and at least one auxiliary part which is integrally formed on the main part, said auxiliary part projecting towards a corresponding one of said blind areas, so that the blind area is reduced by a part of the photosensitive area formed by the auxiliary part of the diffusion region;

each said diffusion region forms a photosensitive area when a bias voltage is applied across a corresponding pn junction, blind areas are formed between adjacent photosensitive areas, and the photosensitive areas are arranged in a substantially contiguous manner so that the adjacent photosensitive areas are in contact with or very close to each other.

2. The photodetector as claimed in claim 1, wherein said diffusion regions are arranged in a matrix arrangement on the surface of said substrate so that the diffusion regions are aligned in horizontal and vertical directions on the surface.

3. The photodetector as claimed in claim 1, wherein said diffusion regions are arranged in a shifted matrix arrangement on the surface of said substrate so that the diffusion regions are aligned in only one of horizontal and vertical directions on the surface.

4. The photodetector as claimed in claim 1, wherein each photosensitive area has an area greater than an area of a corresponding one of said diffusion region.

5. The photodetector as claimed in claim 1, wherein all of said diffusion regions have the same shape.

6. The photodetector as claimed in claim 1, wherein said diffusion regions have two or more different shapes.

7. The photodetector as claimed in claim 1, wherein said substrate is made of a material selected from a group consisting of Hg-Cd-Te, InSb, InAs and PbSnTe.

8. The photodetector as claimed in claim 1, wherein said first semiconductor type is a p-type semiconductor, and said second semiconductor type is an n-type semiconductor.

9. The photodetector as claimed in claim 1, wherein each of said diffusion regions have the main part and the auxiliary part.

10. The photodetector as claimed in claim 1, which further comprises a signal processing part which is electrically coupled to each of said diffusion regions, said signal processing part processing signals output via said diffusion regions when a photoelectric conversion occurs in response to light received by said substrate.

11. A photodetector comprising:

a substrate made of a first semiconductor type and having a surface; and a plurality of independent diffusion regions formed in the surface of said substrate and made of a second semiconductor type which is opposite to the first semiconductor type so that a pn junction is formed between the substrate and each diffusion region, discrete photosensitive areas being formed by each of said diffusion regions and blind areas being formed between adjacent ones of said photosensitive areas when a bias voltage is applied across each pn junction, each of said photosensitive areas having the same area, at least predetermined ones of said diffusion regions having a main part and at least one auxiliary part which is independent of the main part on the surface of said substrate but electrically coupled to the main part, said auxiliary part being provided in a region on the surface of said substrate towards a corresponding one of said blind areas relative to the main part, so that the blind area is reduced by a part of the photosensitive area formed by the auxiliary part of the diffusion region;

each said diffusion region forms a photosensitive area when a bias voltage is applied across a corresponding pn junction, blind areas are formed between adjacent photosensitive areas, and the photosensitive areas are arranged in a substantially contiguous manner so that the adjacent photosensitive areas are in contact with or very close to each other.

12. The photodetector as claimed in claim 11, wherein said diffusion regions are arranged in a matrix arrangement on the surface of said substrate so that the diffusion regions are aligned in horizontal and vertical directions on the surface.

13. The photodetector as claimed in claim 11, wherein said diffusion regions are arranged in a shifted matrix arrangement on the surface of said substrate so that the diffusion regions are aligned in only one of horizontal and vertical directions on the surface.

14. The photodetector as claimed in claim 11, wherein each photosensitive area has an area greater than an area of a corresponding one of said diffusion region.

15. The photodetector as claimed in claim 11, wherein all of said diffusion regions have the same shape.

16. The photodetector as claimed in claim 11, wherein said diffusion regions have two or more different shapes.

17. The photodetector as claimed in claim 11, wherein said substrate is made of a material selected from a group consisting of Hg-Cd-Te, InSb, InAs and PbSnTe.

18. The photodetector as claimed in claim 11, wherein said first semiconductor type is a p-type semiconductor, and said second semiconductor type is an n-type semiconductor.

19. The photodetector as claimed in claim 11, wherein each of said diffusion regions have the main part and the auxiliary part.

20. The photodetector as claimed in claim 11, which further comprises a signal processing part which is electrically coupled to each of said diffusion regions, said signal processing part processing signals output via said diffusion regions when a photoelectric conversion occurs in response to light received by said substrate.

* * * * *